United States Patent [19]
Griffin

[11] Patent Number: 6,137,317
[45] Date of Patent: Oct. 24, 2000

[54] CMOS DRIVER

[75] Inventor: Jed D. Griffin, Forest Grove, Oreg.

[73] Assignee: Intel Corporation, Santa Clara, Calif.

[21] Appl. No.: 09/108,606

[22] Filed: Jul. 1, 1998

[51] Int. Cl.[7] .................. H03K 19/003; H03K 17/16; H03K 19/0175; H03K 19/094
[52] U.S. Cl. .................. 326/87; 326/83; 326/30
[58] Field of Search ............... 326/87, 30, 113, 326/83, 86

[56] References Cited

U.S. PATENT DOCUMENTS

| | | | |
|---|---|---|---|
| 5,391,939 | 2/1995 | Nonaka | 326/83 |
| 5,841,702 | 11/1998 | Kim | 365/189.05 |

Primary Examiner—Michael Tokar
Assistant Examiner—Daniel D. Chang
Attorney, Agent, or Firm—Seth Z. Kalson

[57] ABSTRACT

A CMOS input/output driver having constant output impedance, the driver comprising a drive pMOSFET and a drive nMOSFET for driving an output node HIGH and LOW, an pMOSFET having a drain coupled to the output node and switchable so that its gate is coupled to the output node when the drive pMOSFET is driving the output node HIGH, and an nMOSFET having a drain coupled to the output node and switchable so that its gate is coupled to the output node when the drive nMOSFET is driving the output node LOW. The betas of the drive pMOSFET, the drive nMOSFET, the pMOSFET, and the nMOSFET are matched so that the output impedance of the drive is approximately independent of the output node voltage.

29 Claims, 7 Drawing Sheets

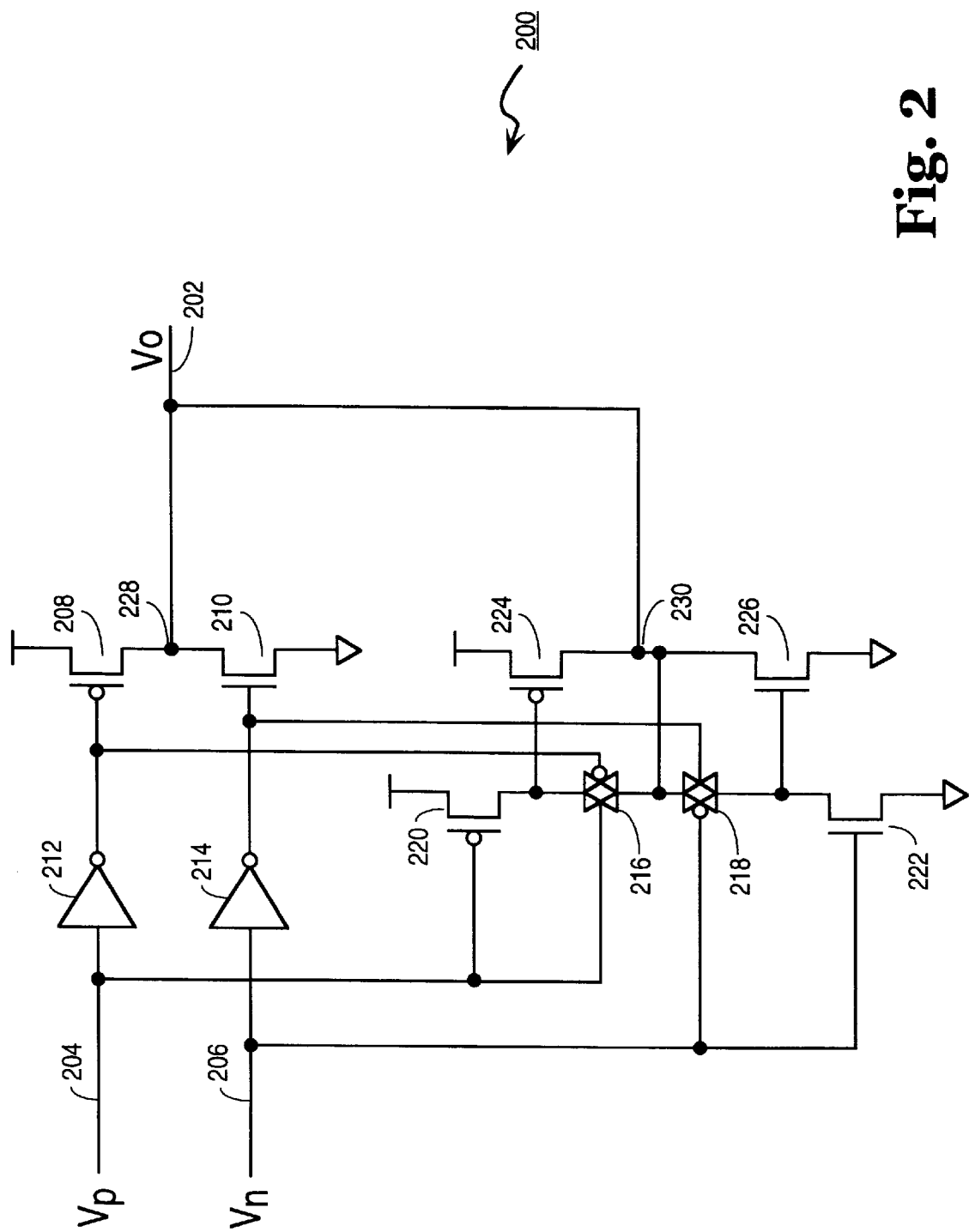

US 6,137,317

CMOS DRIVER

FIELD

Embodiments of the present invention relate to driver circuits, and more particularly, to complementary metal oxide semiconductor drivers for driving transmission lines.

BACKGROUND

FIG. 1 illustrates in a simple fashion an I/O (input/output) driver (buffer, transmitter) 102 communicating with receiver 104 via transmission line 106. Transmission line 106 may be the physical layer of a bus, and has a characteristic impedance $Z_O$.

Suppose driver 102 has transmitted or is transmitting an electromagnetic wave traveling in a direction denoted by arrow 108. If the input impedance of receiver 104 is not equal to $Z_O$, then a reflected wave will propagate in the direction indicated by arrow 110. If the impedance of driver 102 is not matched to the characteristic impedance $Z_O$, then another reflected wave will again be generated, but now traveling in the direction of arrow 108. There will be many multiple reflections, with field vector at any point along transmission line 106 equal to the vector sum (superposition) of the transmitted field vector and all reflected field vectors at that point. This superposition of the transmitted wave and the reflected waves may cause signal degradation, such as ringing, which may limit the speed at which digital data is reliably transmitted from driver 102 to receiver 104.

The first reflected wave can be reduced by terminating the receiving end of transmission line 106 with a receiver or stub having an impedance matched to $Z_O$. However, this may require the use of an off-chip resistor, and furthermore, power may be wasted due to ohmic losses in the resistor.

BRIEF DESCRIPTION OF THE DRAWING

FIG. 2 is an embodiment of the present invention.

DETAILED DESCRIPTION OF EMBODIMENTS

Figure 1:
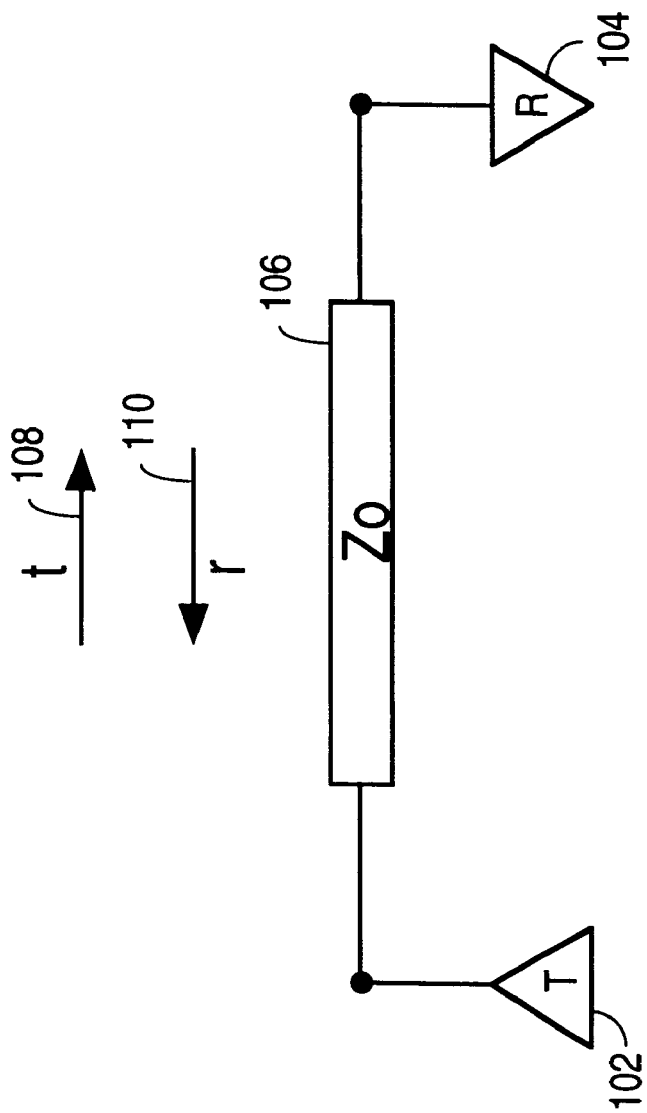
FIG. 1 is a prior art illustration of a driver in communication with a receiver over a transmission line, where the receiver is not matched to the transmission line.

Embodiments are described for I/O drivers having an output impedance that is approximately independent of the output voltage, and which can be adjusted based upon the rail voltage and the characteristics (channel length, width, etc.) of various transistors. This allows for matching the driver's output impedance with the characteristic impedance of a transmission line driven by the I/O driver. If the output impedance is matched to the transmission line, then an electromagnetic wave that is reflected toward the driver will substantially not again be reflected, and therefore signal degradation is reduced, thus allowing for faster, more reliable digital data transmission.

Before describing embodiments, we first introduce some terminology. A two-element Boolean algebra is relevant to switching circuits. For any point in a circuit, the term LOW will denote a set of voltages that map into one of the two Boolean elements, and the term HIGH will denote a set of voltages that map into the other of the two Boolean elements. The particular mapping into Boolean elements depends upon the technology used, and may be different for different parts of a single circuit. To avoid dealing with set terminology, we shall say that a voltage is LOW (HIGH) if it belongs to the set LOW (HIGH). We also follow the convention that for any given node within a circuit, LOW voltages are less than HIGH voltages.

Embodiment 200 in FIG. 2 is part of an I/O driver or buffer for driving a transmission line coupled to 202 (not shown), and provides an approximately constant output impedance when the transmission line is being driven. That is, the impedance of embodiment 200 when "looking into" a port defined by terminal 202 and ground is approximately constant when the transmission line is being driven by embodiment 200.

Transistors 208 and 210 are switched in complementary fashion with respect to each other to drive the transmission line. Usually, when embodiment 200 is driving the transmission line (e.g., it is not tristated), voltages $V_p$ and $V_n$ are such that they are approximately synchronous and equal to each other, and they may be derived from a common input voltage. In some embodiments, however, $V_p$ and $V_n$ are such that $V_p$ transitions from HIGH to LOW before $V_n$ transitions from HIGH to LOW, and $V_p$ transitions from LOW to HIGH after $V_n$ transitions from LOW to HIGH, so that pMOSFET 208 and nMOSFET 210 are not simultaneously ON. Embodiment 200 can be tristated if $V_p$ is set LOW and $V_n$ is set HIGH.

The combination of inverters 212 and 214, transmission gates 216 and 218, pMOSFET 220, and nMOSFET 222 is such that when $V_p$ and $V_n$ are both HIGH the gate of pMOSFET 224 is approximately at the output voltage $V_O$ (i.e., there is a low impedance path from the gate of pMOSFET 224 to its drain) and nMOSFET 226 is OFF, and when $V_p$ and $V_n$ are both LOW the gate of nMOSFET 226 is approximately at the output voltage $V_O$ (i.e., there is a low impedance path from the gate of nMOSFET 226 to its drain) and pMOSFET 224 is OFF.

Figure 3B:
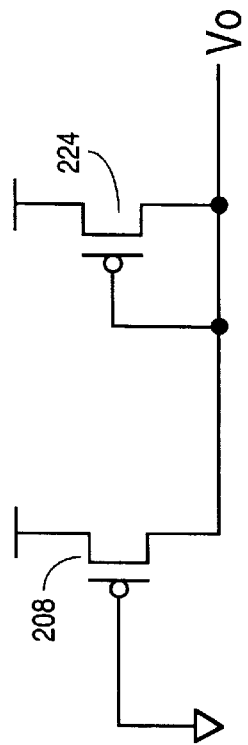
FIGS. 3a and 3b are approximations to the embodiment of FIG. 2 for two particular sets of conditions.
Figure 3A:
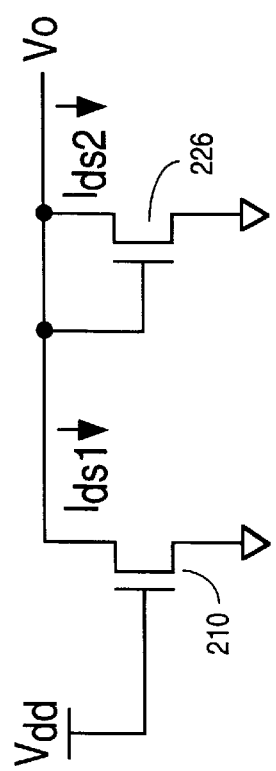

The approximately constant output impedance property of embodiment 200 can be understood by considering FIGS. 3a and 3b, which provide approximations to FIG. 2 for the cases in which $V_p$ and $V_n$ are both LOW and in which $V_p$ and $V_n$ are both HIGH, respectively. The circuits of FIGS. 3a and 3b, however, do not model embodiment 200 during logic transitions of voltages $V_p$ and $V_n$. In FIG. 3a, the input voltage to the gate of nMOSFET 210 is $V_{dd}$, the rail voltage, which is also the voltage of the sources of the pMOSFETs in FIG. 3b. In FIG. 3b, the input voltage to the gate of pMOSFET 208 is at the ground potential.

For purposes of finding an approximate expression for the output impedance of the circuit of FIG. 3a when transistors 210 and 226 are ON, let $I_{ds1}$ denote the drain-source current of nMOSFET 210, and $I_{ds2}$ denote the drain-source current of nMOSFET 226. Let $Z_{out}$ denote the output impedance of the circuit of FIG. 3a. Then the output impedance is given by $$V_O = Z_{out}(I_{ds1} + I_{ds2})$$

Noting that the drain-source voltage ($V_{DS}$) of nMOSFET 210 is equal to $V_O$, and assuming that the threshold voltage of nMOSFET 210 is much less than $V_{dd}$, then an approximate expression for the drain-source current of nMOSFET 210 is given by $$I_{ds1} = \beta_1 \left[ V_{dd} V_0 - \frac{V_0^2}{2} \right],$$

where $\beta_1$ is the beta for nMOSFET 210 and we assume that nMOSFET 210 is in its linear or nonsaturation region. Transistor nMOSFET 226 is configured to be in its saturation region when ON, and provided its threshold voltage $V_T$ is much less than $V_0$, an approximate expression for the drain-source current of nMOSFET 226 is given by $$I_{ds2} = \frac{\beta_2}{2} [V_0 - V_T]^2 \approx \beta_2 \frac{V_0^2}{2},$$

where $\beta_2$ is the beta of nMOSFET 226. Substituting the above two expressions into the expression for the output impedance yields $$V_0 = Z_{out} \left[ \beta_1 V_{dd} V_0 - \beta_1 \frac{V_0^2}{2} + \beta_2 \frac{V_0^2}{2} \right].$$

If the betas of transistors 210 and 226 are sufficiently matched and denoted by $\beta$, then the above expression yields $$Z_{out} = \frac{1}{\beta V_{dd}}.$$

As seen from the above displayed equation, the output impedance of the circuit of FIG. 3a (when transistors 210 and 226 are ON) is approximately constant (i.e., independent of $V_0$). A similar analysis shows that the output impedance of the circuit of FIG. 3b is also (approximately) given by the above displayed equation, provided the betas are matched.

In another class of embodiments, drive transistors 208 and 210 may be replaced by a first and a second plurality of drive transistors, respectively, so that subsets of the first and second pluralities of drive transistors can be selected so as to provide a programmable output impedance. In this case, to match betas, transistors 224 and 226 would be replaced by a third and a fourth plurality of transistors, respectively, so that the proper subset of the third and fourth plurality transistors can be selected, depending upon the selected subset of the first and second plurality of drive transistors, so that the output impedance is programmable and approximately independent of output voltage $V_0$.

Figure 4:
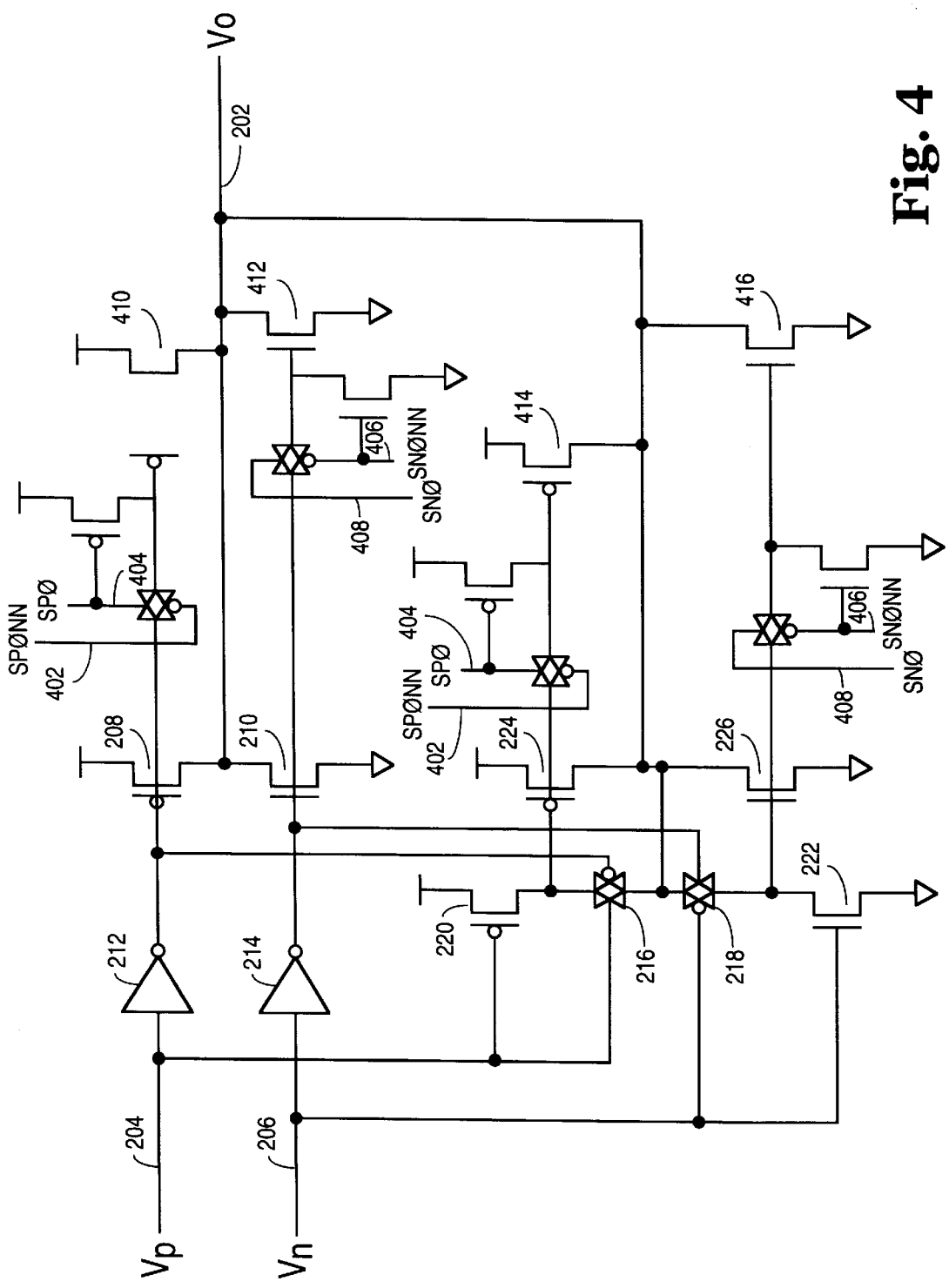
FIG. 4 is an embodiment of the present invention having a programmable output impedance.

An embodiment belonging to the previously described class of embodiments is illustrated in FIG. 4, where corresponding components in FIGS. 2 and 4 have the same numeric label. In FIG. 4, signals, sp0, sp0nn, sn0, and sn0nn, on lines 404, 402, 408, and 406, respectively, are select signals, where sp0 is the logical (Boolean) complement of sp0nn and sn0 is the logical complement of sn0nn. If sp0 and sn0 are LOW, then transistors 410, 412, 414, and 416 are OFF and the circuit of FIG. 4 behaves as embodiment 200 of FIG. 2. However, if sp0 and sn0 are each HIGH, then transistors 410, 412, 414, and 416 affect the output impedance.

Figure 5:
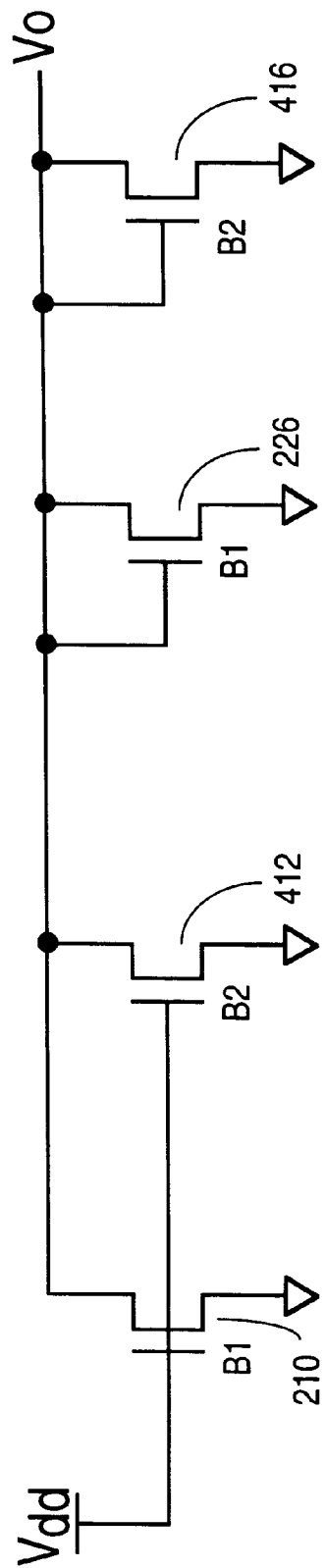
FIG. 5 is an approximation to the embodiment of FIG. 4 for a particular set of conditions.

To determine the output impedance when sp0 and sn0 are each HIGH, consider the case in which voltages $V_p$ and $V_n$ are each LOW, so that the circuit of FIG. 4 can be represented by the circuit of FIG. 5. Let the betas of transistors 210 and 226 be matched 20 and denoted as $\beta_1$ and the betas of transistors 412 and 416 be matched and denoted as $\beta_2$. Then a similar analysis as discussed earlier yields the approximate expression for the output impedance, $$Z_{out} = \frac{1}{[\beta_1 + \beta_2] V_{dd}}.$$

Clearly, by utilizing a plurality of transmission gates, select lines, and matched pairs of transistors, the output impedance can be programmed as desired and made approximately independent of output voltage.

Figure 6:
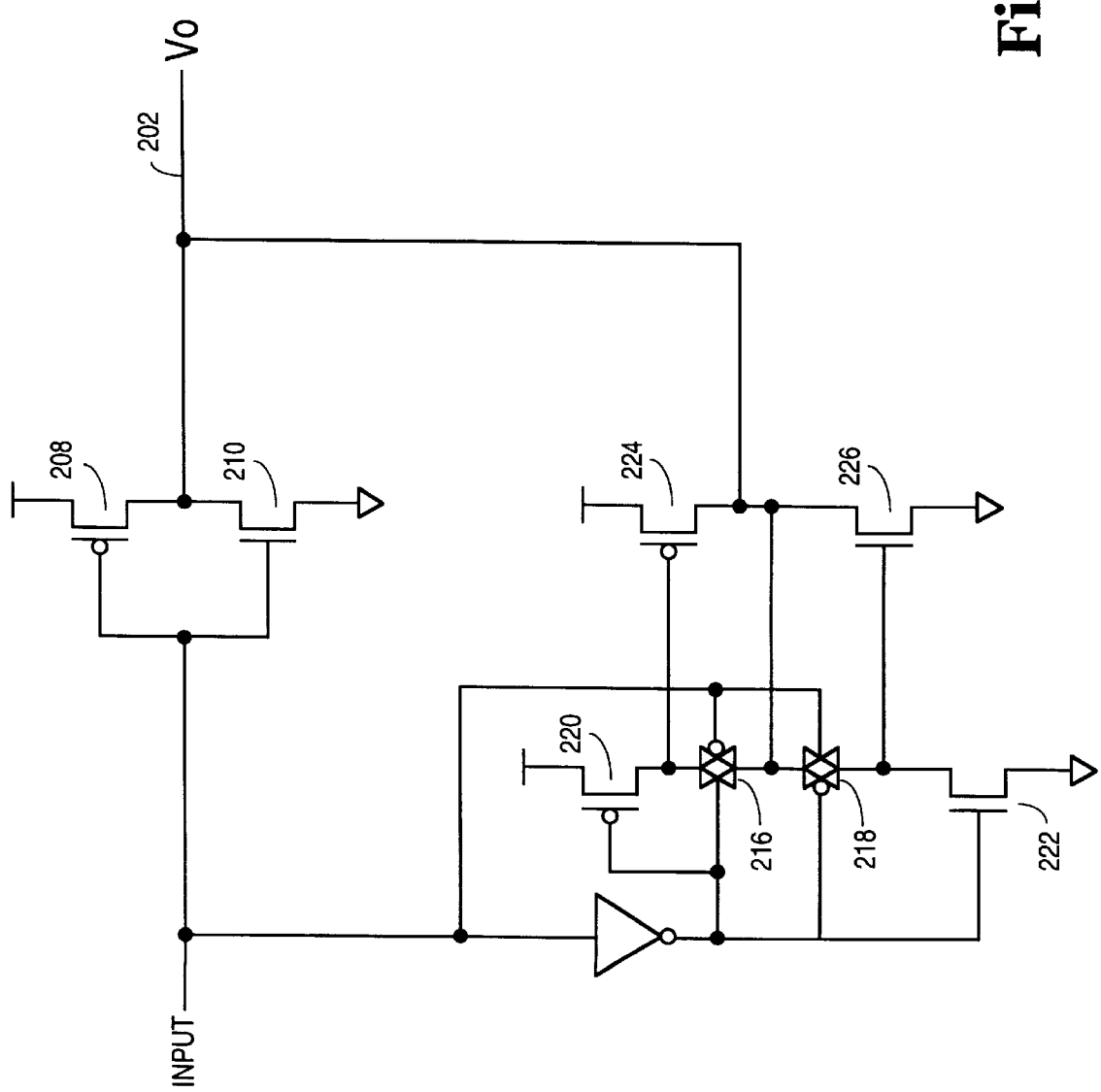
FIG. 6 is another embodiment of the present invention.

FIG. 6 is an alternative embodiment similar to FIG. 2, except that one less inverter is employed, but now the voltages at the gates of drive transistors 208 and 210 are essentially identical and are not separately controllable. It should be appreciated that the transient characteristics of the circuit of FIG. 6 during logic transitions may be different from that of FIG. 2.

Figure 7:
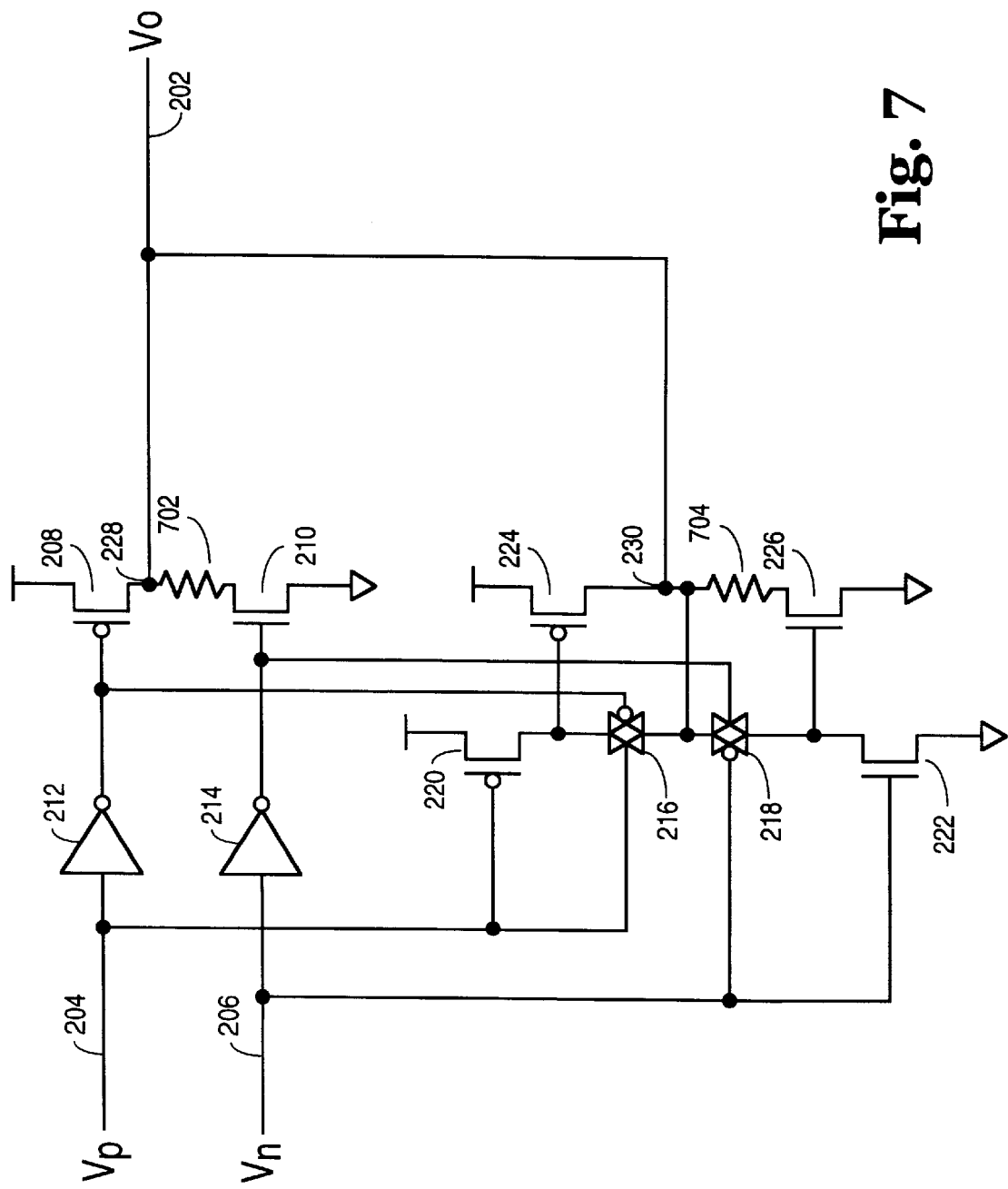
FIG. 7 is another embodiment of the present invention.

In some embodiments, the drains of the nMOSFETs that are responsive to the output voltage $V_0$ may be first connected to electrostatic discharge (ESD) resistors so as to help reduce damage due to electrostatic discharge through output terminal 202. For example, in FIG. 2, a ESD resistor may be connected between the drain of nMOSFET 210 and node 228, and a ESD resistor may be connected between the drain of nMOSFET 226 and node 230. This is shown in FIG. 7 where resistors 702 and 704 are ESD resistors. However, the resistance values of the ESD resistors are chosen so that under normal operation, the voltage drops across the ESD resistors are small enough so that the voltages on the respective drains of the nMOSFETs are substantially equal to the output voltage $V_0$.

Various modifications may be made to the embodiments discussed above without departing from the scope of the invention as claimed below. For example, additional devices may be inserted between various nodes, terminals, and devices in the above embodiments without materially changing their overall function. For example, voltage drops may be introduced by resistors, diodes, or transistors configured as diodes, to change various voltage levels, or buffers may be inserted between various nodes, terminals, and devices.

For this reason, we give a precise definition to connection. We say that for any objects A and B in which a voltage is well defined, an object A is connected to an object B if they are connected together by a transmission line, or equivalently, a waveguide. A transmission line or waveguide is any structure for guiding electromagnetic waves. Part or all of the transmission line or waveguide may be non-metallic, such as polysilicon.

If objects A and B are coupled to each other, then they may be connected to each other as discussed above, or other means may be employed for relating the voltages of objects A and B, such as diodes, buffers, or other active or passive circuits. For these letters patent, we shall define a relationship between voltages as follows. We shall say that the voltage of an object A is related to the voltage of an object B by a strictly increasing function if the following holds: There exists a non-zero voltage interval (a, b) and a function $f$ strictly increasing on (a, b) for which $V_A(t_2) = f(V_B(t_1))$, where $V_A(t_2)$ is the voltage of object A at time $t_2$ and $V_B(t_1)$ is the voltage of object B at time $t_1$, where $t_2 > t_1$, and $V_B(t_1) \in (a, b)$. The time difference $t_2 - t_1$ may be a function of $V_B(t_1)$. In practice, $f$ is actually a function of more than one variable, but we assume that these other variables are held constant in the above definition.

I claim:

1. A driver comprising:
an output node;
a drive pMOSFET having a drain connected to the output node to drive the output node HIGH; and
a pMOSFET having a drain connected to the output node, wherein the sources of the drive pMOSFET and the pMOSFET are at substantially the same voltage, and the pMOSFET is controllable to couple its gate to the output node so that its gate voltage is substantially equal to the output node voltage, wherein the drive pMOSFET and the pMOSFET have matched betas.

2. The driver as set forth in claim 1, further comprising:
a drive nMOSFET having a drain connected to the output node to drive the output node LOW; and
a nMOSFET having a drain connected to the output node, wherein the sources of the drive nMOSFET and the nMOSFET are at substantially the same voltage, and the nMOSFET is controllable to couple its gate to the output node so that its gate voltage is substantially equal to the output node voltage; wherein the drive nMOSFET, the drive pMOSFET, the pMOSFET, and the nMOSFET have matched betas.

3. The driver as set forth in claim 1, further comprising:
a first resistor connected to the output node;
a drive nMOSFET having a drain connected to the first resistor;
a second resistor connected to the output node; and
a nMOSFET having a drain connected to the second resistor, wherein the sources of the drive nMOSFET and the nMOSFET are at substantially the same voltage, and the nMOSFET is controllable to couple its gate to the output node so that its gate voltage is substantially equal to the output node voltage; wherein the drive nMOSFET, the drive pMOSFET, the pMOSFET, and the nMOSFET have matched betas.

4. A driver having an output node, the driver comprising:
a drive pMOSFET to drive the output node HIGH, wherein if the drive pMOSFET is ON its drain voltage is substantially equal to the output node voltage;
a drive nMOSFET to drive the output node LOW, wherein if the drive nMOSFET is ON its drain voltage is substantially equal to the output node voltage;
a pMOSFET; and
a nMOSFET; wherein
the drive pMOSFET and the pMOSFET are to provide in combination a current conducting path from their sources to the output node where the drain-source voltages of the drive pMOSFET and the pMOSFET are substantially equal to each other and the gate and drain voltages of the pMOSFET are substantially equal to each other only if both the drive pMOSFET and the pMOSFET are ON; and
the drive nMOSFET and the nMOSFET are to provide in combination a current conducting path from their sources to the output node where the drain-source voltages of the drive nMOSFET and the nMOSFET are substantially equal to each other and the gate and drain voltages of the nMOSFET are substantially equal to each other only if both the drive nMOSFET and the nMOSFET are ON.

5. The driver as set forth in claim 4, wherein
the drain of the pMOSFET is at substantially the output node voltage if the pMOSFET is ON; and
the drain of the nMOSFET is at substantially the output node voltage if the nMOSFET is ON.

6. The driver as set forth in claim 4, wherein
the drain voltage of the pMOSFET is related to the output node voltage by a strictly increasing function if the pMOSFET is ON; and
the drain voltage of the nMOSFET is related to the output node voltage by a strictly increasing function if the nMOSFET is ON.

7. The driver as set forth in claim 4, wherein the drive pMOSFET, the drive nMOSFET, the pMOSFET, and the nMOSFET have matched betas.

8. The driver as set forth in claim 5, wherein the drive pMOSFET, the drive nMOSFET, the pMOSFET, and the nMOSFET have matched betas.

9. The driver as set forth in claim 6, wherein the drive pMOSFET, the drive nMOSFET, the pMOSFET, and the nMOSFET have matched betas.

10. A driver having an output node, the driver comprising:
a drive pMOSFET to provide a current conducting path between the output node and a high-side node only if ON, wherein if the drive pMOSFET is ON its drain voltage is substantially equal to the output node voltage;
a drive nMOSFET to provide a current conducting path between the output node and a low-side node only if ON, wherein if the drive nMOSFET is ON its drain voltage is substantially equal to the output node voltage;
a pMOSFET to provide a current conducting path between the output node and the high-side node only if ON, the pMOSFET and the drive pMOSFET controllable so that there is a first non-zero time interval for which: the pMOSFET and the drive pMOSFET are both ON, the drain-source voltages of the pMOSFET and the drive pMOSFET are substantially equal to each other, and the gate and drain voltages of the pMOSFET are substantially equal to each other; and
a nMOSFET to provide a current conducting path between the output node and the low-side node only if ON, the nMOSFET and the drive nMOSFET controllable so that there is a second non-zero time interval for which: the nMOSFET and the drive nMOSFET are both ON, the drain-source voltages of the nMOSFET and the drive nMOSFET are substantially equal to each other, and the gate and drain voltages of the nMOSFET are substantially equal to each other.

11. The driver as set forth in claim 10, wherein
the drain voltage of the pMOSFET is substantially equal to the output node voltage if the pMOSFET is ON; and
the drain voltage of the nMOSFET is substantially equal to the output node voltage if the nMOSFET is ON.

12. The driver as set forth in claim 10, wherein
the drain voltage of the pMOSFET is related to the output node voltage by a strictly increasing function if the pMOSFET is ON; and
the drain voltage of the nMOSFET is related to the output node voltage by a strictly increasing function if the nMOSFET is ON.

13. The driver as set forth in claim 10, wherein the first and second time intervals are disjoint.

14. The driver as set forth in claim 10, wherein the driver provides a current conducting path between output node and the high-side node having an impedance $Z_{out}(p)$ substantially given by $$\frac{1}{Z_{out}(p)} = \frac{1}{Z_1} + \frac{1}{Z_p}$$

if the drive pMOSFET and the pMOSFET are both ON and the drive nMOSFET and the nMOSFET are both OFF, where $Z_1$ and $Z_p$ are the impedances of the drive pMOSFET and the pMOSFET, respectively; and wherein the driver provides a current conducting path between output node and the low-side node having an impedance $Z_{out}$ (n) substantially given by $$\frac{1}{Z_{out}(n)} = \frac{1}{Z_2} + \frac{1}{Z_n}$$

if the drive nMOSFET and the nMOSFET are both ON and the drive pMOSFET and the pMOSFET are both OFF, where $Z_2$ and $Z_n$ are the impedances of the drive nMOSFET and the nMOSFET, respectively.

15. A driver having an output node, the driver comprising:
a first input node;
a second input node;
a drive pMOSFET to provide a current conducting path between the output node and a high-side node only if ON, wherein if the drive pMOSFET is ON its drain voltage is substantially equal to the output node voltage;
a drive nMOSFET to provide a current conducting path between the output node and a low-side node only if ON, wherein if the drive nMOSFET is ON its drain voltage is substantially equal to the output node voltage;
a pMOSFET to provide a current conducting path between the output node and the high-side node only if ON; and
a nMOSFET to provide a current conducting path between the output node and the low-side node only if ON;
wherein the drive pMOSFET and the pMOSFET are coupled to the first input node to both be ON and have drain-source voltages substantially equal to each other where the gate and drain voltages of the pMOSFET are substantially equal to each other if the first input node is at a voltage level representative of a Boolean element X belonging to a two-element Boolean algebra; and
wherein the drive nMOSFET and the nMOSFET are coupled to the second input node to both be ON and have drain-source voltages substantially equal to each other where the gate and drain voltages of the nMOSFET are substantially equal to each other if the second input node is at a voltage level representative of a Boolean element Y belonging to the two-element Boolean algebra.

16. The driver as set forth in claim 15, wherein the first and second input nodes are the same node.

17. The driver as set forth in claim 15, wherein the element X is the Boolean complement of the element Y.

18. The driver as set forth in claim 15, wherein
the drain voltage of the pMOSFET is substantially equal to the output node voltage if ON; and
the drain voltage of the nMOSFET is substantially equal to the output node voltage if ON.

19. The driver as set forth in claim 15, wherein
the drain voltage of the pMOSFET is related to the output node voltage by a strictly increasing function if the pMOSFET is ON; and the drain voltage of the nMOSFET is related to the output node voltage by a strictly increasing function if the nMOSFET is ON.

20. The driver as set forth in claim 18, wherein the driver provides a current conducting path between output node and the high-side node having an impedance $Z_{out}$ (p) substantially given by $$\frac{1}{Z_{out}(p)} = \frac{1}{Z_1} + \frac{1}{Z_p}$$

if the drive pMOSFET and the pMOSFET are both ON and the drive nMOSFET and the nMOSFET are both OFF, where $Z_1$ and $Z_p$ are the impedances of the drive pMOSFET and the pMOSFET, respectively; and wherein the driver provides a current conducting path between output node and the low-side node having an impedance $Z_{out}$ (n) substantially given by $$\frac{1}{Z_{out}(n)} = \frac{1}{Z_2} + \frac{1}{Z_n}$$

if the drive nMOSFET and the nMOSFET are both ON and the drive pMOSFET and the pMOSFET are both OFF, where $Z_2$ and $Z_n$ are the impedances of the drive nMOSFET and the nMOSFET, respectively.

21. The driver as set forth in claim 15, wherein the drive pMOSFET, the drive nMOSFET, the pMOSFET, and the nMOSFET have matched betas.

22. The driver as set forth in claim 18, wherein the drive pMOSFET, the drive nMOSFET, the pMOSFET, and the nMOSFET have matched betas.

23. The driver as set forth in claim 19, wherein the drive pMOSFET, the drive nMOSFET, the pMOSFET, and the nMOSFET have matched betas.

24. A driver having an output node, the driver comprising:
a first input node;
a second input node;
a drive pMOSFET to provide a current conducting path between the output node and a high-side node only if ON, wherein if the drive pMOSFET is ON its drain voltage is substantially equal to the output node voltage;
a drive nMOSFET to provide a current conducting path between the output node and a low-side node only if ON, wherein if the drive nMOSFET is ON its drain voltage is substantially equal to the output node voltage;
a pMOSFET to provide a current conducting path between the output node and the high-side node only if ON; and
a nMOSFET to provide a current conducting path between the output node and the low-side node only if ON;
wherein the pMOSFET is coupled to the first input node so as to be ON, to have a gate voltage related to the output node voltage by a strictly increasing function, and to have a drain voltage related to the output node voltage by a strictly increasing function if the first input node is at a voltage level representative of a Boolean element X belonging to a two-element Boolean algebra; and
wherein the nMOSFET is coupled to the second input node so as to be ON, to have a gate voltage related to the output node voltage by a strictly increasing function, and to have a drain voltage related to the output node voltage by a strictly increasing function if the second input node is at a voltage level representative of a Boolean element Y belonging to the two-element Boolean algebra.

25. The driver as set forth in claim 24, wherein the drive pMOSFET is ON only if the first input node is at a voltage level representative of the Boolean element X, and its source voltage is related to the high-side node voltage by a strictly increasing function if ON;

the drive nMOSFET is ON only if second input node is at a voltage level representative of the Boolean element Y, and its source voltage is related to the low-side node voltage by a strictly increasing function if ON;

the pMOSFET has a source voltage related to the high-side node voltage by a strictly increasing function if ON;

the nMOSFET has a source voltage related to the low-side node voltage by a strictly increasing function if ON;

the drain voltage of the pMOSFET is related to the output node voltage by a strictly increasing function if ON; and the drain voltage of the nMOSFET is related to the output node voltage by a strictly increasing function if ON.

26. The driver as set forth in claim 25, wherein the drive pMOSFET, the drive nMOSFET, the pMOSFET, and the nMOSFET have matched betas.

27. A method for driving a transmission line with a matched driver, the method comprising:

switching ON a drive pMOSFET to excite an electromagnetic wave propagating along the transmission line; and coupling a pMOSFET to the transmission line to be in its saturation region so that the combination of the drive pMOSFET and the pMOSFET, when the drive pMOSFET is ON, provide an approximately matched impedance to the transmission line, wherein the drive pMOSFET and the pMOSFET have matched betas.

28. The method as set forth in claim 27, further comprising:

switching ON a drive nMOSFET to excite an electromagnetic wave propagating along the transmission line; and coupling a nMOSFET to the transmission line to be in its saturation region so that the combination of the drive nMOSFET and the nMOSFET, when the drive nMOSFET is ON, provide an approximately matched impedance to the transmission line, wherein the drive nMOSFET, the nMOSFET, the drive pMOSFET, and the pMOSFET have matched betas.

29. A driver comprising:

an output node having an output voltage;

at least one drive pMOSFET having at least one drain coupled to the output node to drive the output node HIGH; and at least one pMOSFET having at least one drain coupled to the output node;

wherein the at least one drive pMOSFET and the at least one pMOSFET are controllable to both be switched ON so that:

the at least one drive pMOSFET and the at least one pMOSFET have substantially equal drain-to-source voltages;

the at least one pMOSFET has a gate voltage substantially equal to its drain voltage, and the drain voltages of the at least one drive pMOSFET and the at least one pMOSFET are substantially equal to the output node voltage; and the at least one drive pMOSFET has a first effective beta and the at least one pMOSFET has a second effective beta matched to the first effective beta.

* * * * *